United States Patent
Cheng et al.

(10) Patent No.: US 7,026,233 B2
(45) Date of Patent: Apr. 11, 2006

(54) METHOD FOR REDUCING DEFECTS IN POST PASSIVATION INTERCONNECT PROCESS

(75) Inventors: Hsi-Kuei Cheng, Hsin-Chu (TW); Hung-Ju Chien, Hsin-chu (TW); Hsun-Chang Chan, Hsin-chu (TW); Chu-Chang Chen, Hsin-Chu (TW); Ying-Lang Wang, Hsin-Chu (TW); Chin-Hao Su, Hsin-Chu (TW); Hsien-Ping Feng, Taipei (TW); Shih-Tzung Chang, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/635,621

(22) Filed: Aug. 6, 2003

(65) Prior Publication Data
US 2005/0032353 A1   Feb. 10, 2005

(51) Int. Cl.
*H01L 21/50* (2006.01)
*H01L 21/44* (2006.01)
*H01L 21/4763* (2006.01)
*H01L 21/461* (2006.01)

(52) U.S. Cl. ............ 438/612; 438/106; 438/622; 438/692; 438/706

(58) Field of Classification Search ........ 438/622–624, 438/692, 706, 902, 958
See application file for complete search history.

(56) References Cited

U.S. PATENT DOCUMENTS

| | | | | |
|---|---|---|---|---|
| 5,075,965 A | * | 12/1991 | Carey et al. | .................. 29/840 |
| 5,880,529 A | * | 3/1999 | Barrow | ........................ 257/782 |
| 6,022,809 A | * | 2/2000 | Fan | ............................ 438/710 |
| 6,165,886 A | | 12/2000 | Lin et al. | |
| 6,174,824 B1 | * | 1/2001 | Michael et al. | ............ 438/778 |
| 6,261,944 B1 | * | 7/2001 | Mehta et al. | ............... 438/624 |
| 6,313,024 B1 | * | 11/2001 | Cave et al. | ................. 438/598 |
| 6,455,885 B1 | | 9/2002 | Lin | |
| 6,495,442 B1 | | 12/2002 | Lin et al. | |
| 2001/0045651 A1 | * | 11/2001 | Saito et al. | ................ 257/750 |

FOREIGN PATENT DOCUMENTS

| | | |
|---|---|---|
| EP | 1 168 437 A2 | 1/2002 |
| JP | 2002-075981 | 3/2002 |
| TW | 502377 | 9/2002 |

* cited by examiner

*Primary Examiner*—Ha Tran Nguyen
(74) *Attorney, Agent, or Firm*—Slater & Matsil, L.L.P.

(57) ABSTRACT

A method of forming post passivation interconnects for an integrated circuit is disclosed. A passivation layer of a non-oxide material is formed over the integrated circuit. A buffer layer is then formed over the passivation layer. The buffer layer preferably is a silicon oxide layer with a thickness substantially smaller than a thickness of the passivation layer. A post passivation metal layer is deposited over the buffer layer and a connection pattern is formed in the post passivation metal layer.

25 Claims, 5 Drawing Sheets

METHOD FOR REDUCING DEFECTS IN POST PASSIVATION INTERCONNECT PROCESS

TECHNICAL FIELD

The present invention relates generally to integrated circuits, and more particularly to a method for reducing defects in a post passivation interconnect process.

BACKGROUND

An integrated circuit generally is fabricated on and within a substrate and includes multiple layers of materials. These multiple layers of materials can include semiconductor layers (e.g., silicon), metal layers (e.g., copper or aluminum), and insulating layers (e.g., silicon oxide or silicon nitride). An integrated circuit can also include a passivation layer for protecting underlying layers from moisture, contamination, or other conditions that can potentially degrade or damage the integrated circuit. An integrated circuit generally includes contact regions for connecting the integrated circuit to other circuits. Point contacts are generally formed in metal layers, e.g., the top level of metal.

For example, FIG. 1 shows a cross section of an integrated circuit 10 fabricated on a substrate 12. Integrated circuit 10 includes contact regions 16a, 16b and 16c (collectively 16) within a metal layer 14. Integrated circuit 10 also includes other layers of materials beneath metal layer 14. These layers of materials underneath metal layer 14 are depicted generally as other layers 13 in FIG. 1. Integrated circuit 10 is protected by a passivation layer 18.

In a post passivation interconnect ("PPI") process, contact pads and other conductors are fabricated on top of the passivation layer 18 and connected to the contact regions 16 of the integrated circuit 10. These interconnects can be used to re-route the connections to integrated circuit 10 to facilitate contact to the package.

FIG. 2a shows a cross section of integrated circuit 10 after a conventional PPI process, and FIG. 2b shows a top view of this same device. The PPI process has formed a connection pattern over passivation layer 18. The connection pattern includes contact pads 26a and 26b, as well as conductors 40b and 40c. After the connection pattern is fabricated, as shown in FIG. 2b, conductor 40b is connected to contact pad 26b, and conductor 40c is connected to other surrounding regions (not shown). Contact pad 26a, conductor 40b, and conductor 40c are connected, respectively, to contacts regions 40a, 40b and 40c.

SUMMARY OF THE INVENTION

The present invention describes embodiments of a method for reducing defects in a post passivation interconnect process and resulting structures.

In one embodiment, a method of depositing a conductive layer over an integrated circuit is described. A substantially completed integrated circuit includes a silicon nitride passivation layer at an uppermost surface. An oxide buffer layer is formed over and abutting the silicon nitride passivation layer. The oxide buffer layer has a thickness that is substantially smaller than that of the passivation layer. The oxide buffer layer is etched and a metal layer is formed over and abutting the oxide buffer layer. This layer can then be patterned.

A second embodiment teaches a method of forming post passivation interconnects for an integrated circuit. A passivation layer of a non-oxide material is formed over the integrated circuit. A buffer layer is then formed over the passivation layer. The buffer layer preferably is a silicon oxide layer with a thickness substantially smaller than a thickness of the passivation layer. A post passivation metal layer is deposited over the buffer layer and a connection pattern is formed in the post passivation metal layer.

Aspects of the present invention also relate to integrated circuits, both packaged and before. For example, a semiconductor device includes a silicon substrate having a plurality of active devices formed therein. The active devices are interconnected by a number of metal layers including an uppermost metal layer. The uppermost metal layer includes a plurality of contact regions. A nitride passivation layer overlies the uppermost metal layer except for a portion of the contact regions. An oxide buffer layer overlies the passivation layer and has a thickness substantially smaller than that of the passivation layer. A post passivation metal layer overlies the oxide buffer layer and is patterned so as to electrically couple the plurality of contact regions to a plurality of contact pads formed in the post passivation metal layer.

Embodiments of the invention can have one or more of the following advantages. The number of defects generated during the improved PPI process can be reduced. The time intervals between subsequent prevention maintenances for the improved PPI process can be reduced. Additional advantages can be realized by people skilled in the art.

BRIEF DESCRIPTION OF THE DRAWINGS

For a more complete following descriptions taken in conjunction with the accompanying drawings, in which understanding of the present invention, and the advantages thereof, reference is now made to the.

DETAILED DESCRIPTION OF ILLUSTRATIVE EMBODIMENT

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 3A:
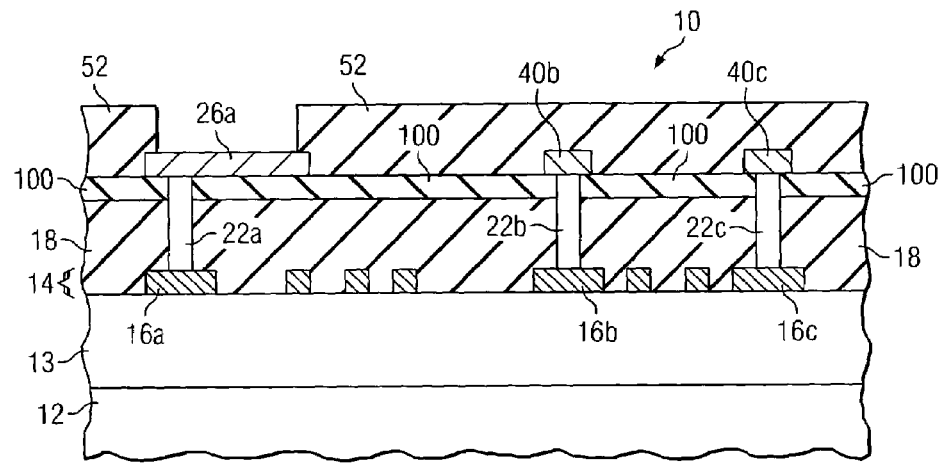
FIGS. 3a and 3b show a cross sectional and top view of an integrated circuit of an embodiment of the present invention.
Figure 3B:
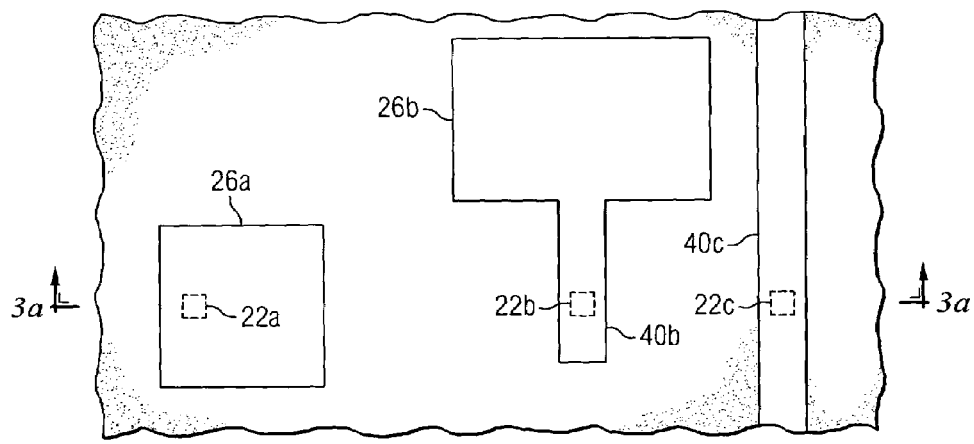

FIG. 3a shows a cross-sectional view of an integrated circuit 10 of a preferred embodiment of the present invention. The top view of integrated circuit 10 is shown in FIG. 3b. As in the prior art, integrated circuit 10 includes a substrate 12 and a number of layers 13, e.g., metal interconnect lines and dielectrics. The substrate 12 typically comprises silicon but other substrates including other semiconductors, e.g., germanium, silicon-germanium, gallium arsenide, and layered substrates, e.g., silicon-on-insulator, silicon-on-sapphire can be used.

The integrated circuit can comprise any type of circuit. For example, the integrated circuit 10 could be a logic device, e.g., processor, controller or other, or a memory device, e.g., random access memory and/or non-volatile memory. In the preferred embodiment, the layers 13 comprise copper interconnect lines that are separated from one another by low-k dielectric materials. Other materials can be used. Top level metal 16 comprises the final interconnect level and, along with other layers 13, completes the circuitry of integrated circuit 10.

Passivation layer 18 is the topmost layer of integrated circuit 10. This layer is formed after the circuitry of integrated circuit 10 is substantially complete. In other words, the circuits of the device are fully interconnected and operational when the passivation layer 18 is formed. The only remaining step is to provide access to power, ground and other signals so that the device can be coupled to other components.

In the preferred embodiment, passivation layer 18 is formed from silicon nitride (e.g., $Si_3N_4$). In other embodiments, other materials and layers can be used. In one example, a layer of HDP (high density plasma) oxide is formed over upper level metal 16 and a layer of silicon nitride is formed over the HDP oxide. For example, the HDP oxide layer may be about 1000 nm thick and the nitride may be about 600 nm thick.

In the preferred embodiment, passivation layer 18 is formed from a non-oxide material. This means that the exposed outer-most layer of passivation layer 18 is not formed from an oxide. For example, the non-oxide material can be silicon nitride. The present invention also has application when the passivation layer 18 is a thick oxide film.

In the embodiment of FIG. 3a, a buffer layer 100 is formed over the passivation layer 100. In the preferred embodiment, buffer layer 100 is formed from a thin layer of silicon oxide (e.g., $SiO_2$) 100. Other oxides can be used. As will be discussed below, the buffer layer helps to reduce contamination during a subsequent PPI process.

FIG. 3a also shows the PPI pattern that is fabricated over the silicon oxide layer 100. The connection pattern includes contact pads 26a and 26b, and conductors 40b and 40c. In this illustration, contact pad 26a, conductor 40b, and conductor 40c are coupled, respectively, to contact regions 16a, 16b and 16c in the upper level of metal. In the preferred embodiment, PPI metalization is formed form a layer of aluminum copper.

A final passivation layer 52 is formed over the integrated circuit 10. Layer 52 includes openings to expose the contact pads 26. In the preferred embodiment, the final passivation is formed from polyimide. It is understood, however, that other materials can be used.

Figure 4:
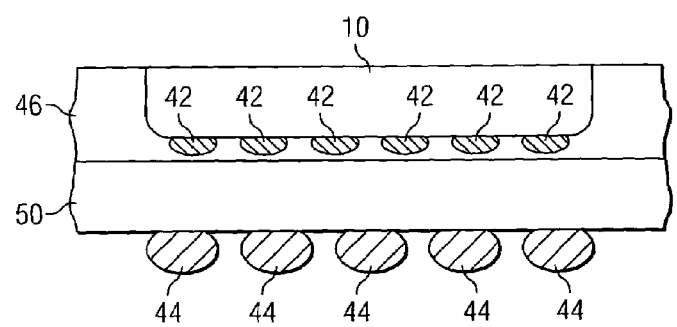
FIG. 4 shows a packaged integrated circuit of an embodiment of the present invention.

FIG. 4 provides a cross-sectional view of an integrated circuit 10 packaged in accordance to an embodiment of the present invention. In this example, the integrated circuit 10 is packaged in a flip chip scheme where the upper surface of the chip 10 (i.e., the surface with the contact pads 26) is adjacent the package substrate 50. The integrated circuit 10 can be either partially or fully encapsulated for protection, for example by material 42.

Contact pads 26 on the integrated circuit 10 (see FIG. 4) will be attached to corresponding contact pads (not shown) on substrate 50 via solder bumps 42. Conductors (not shown) within the substrate 50 will electrically couple contact pads 26 to ball grid array (BGA) solder balls 44. The BGA solder balls 44 can then be mounted on a printed circuit board (not shown).

Figure 5A:
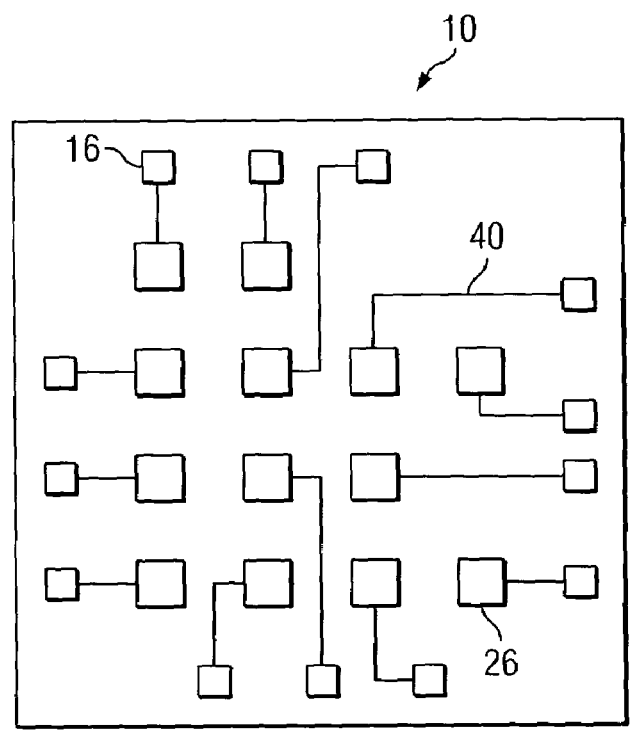
FIGS. 5a and 5b show two examples of how the PPI pattern can re-route the contact pads.

One advantage of using the PPI process is that the configuration of contact regions on integrated circuit 10 can be modified to match the packaging technology. For example, FIG. 5a shows a plan view of the integrated circuit 10 including contact regions 26, conductors 40 and contact regions 16. In this case, the substantially completed integrated circuit included contact regions 16 located around the periphery of the integrated circuit 10. This configuration is convenient for wire bonded packaging processes.

In wafer scale integration and other packaging processes, however, it is desirable that the chip contacts be located in an array over the entire surface of the chip. This is the configuration of contact pads 26 shown in FIG. 5a. Conductors 40 are shown to electrically couple each contact pad 26 to a respective one of the contact regions 16. In this manner, the contact pads 26 can be in the same physical configuration as associated contacts (not shown) on substrate 50 and can be physically and electrically coupled, e.g., by solder bumps 42.

Figure 5B:
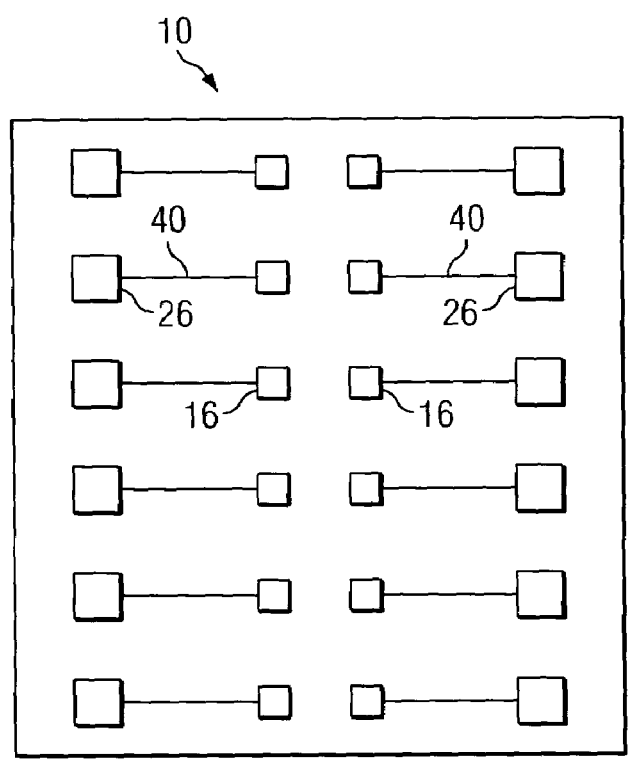

FIG. 5b shows another embodiment where the contact regions 16 are located along a center line of the integrated circuit 10. This configuration is often used, for example, in memory devices (such as dynamic random access memory). In this example, the contact pads 26 are spaced from the contact regions 16 along two columns. It is understood that the configuration of contact pads 26 could have been the same as the configuration shown in FIG. 5a and vice versa. While not clear from the figures, the contact pad 26 is typically larger than the contact region 16.

Figure 6A:
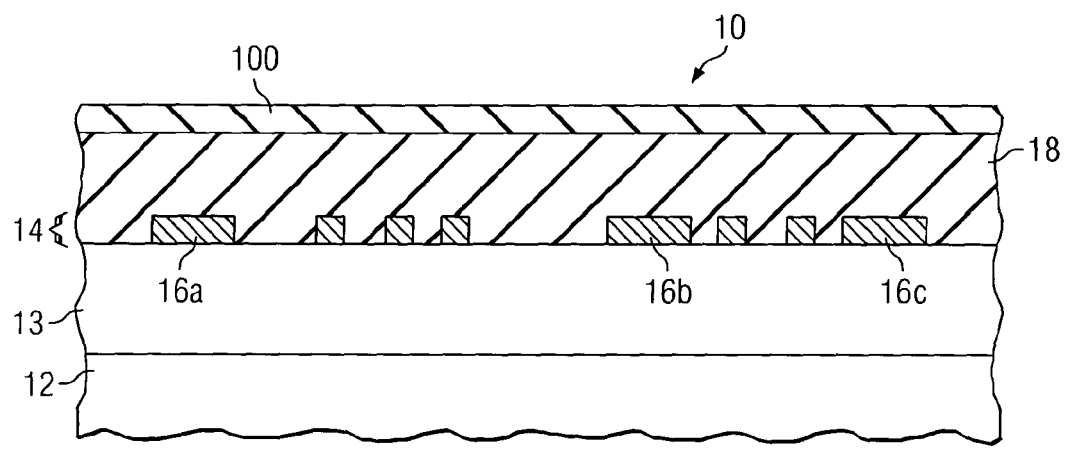
FIGS. 6a–6d show cross-sectional views at various stages of the improved PPI process.
Figure 6B:
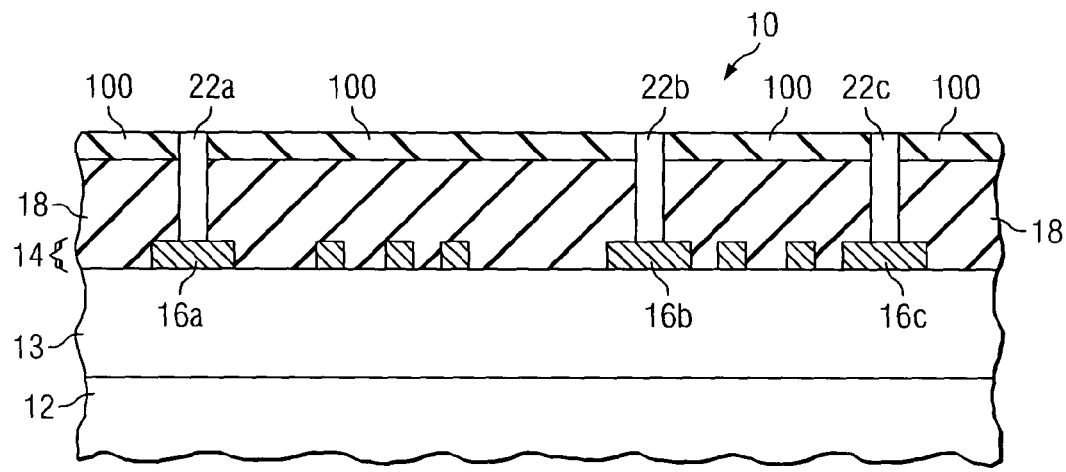
Figure 6C:
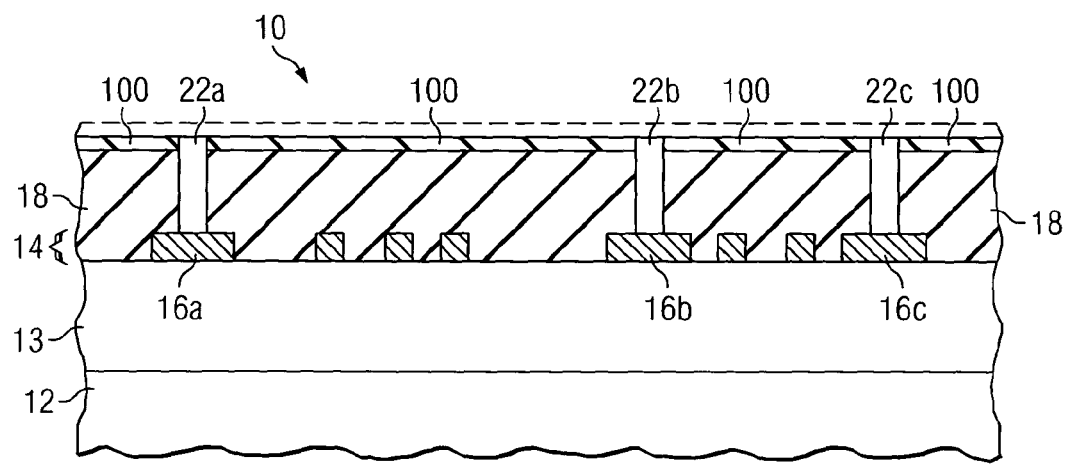
Figure 6D:
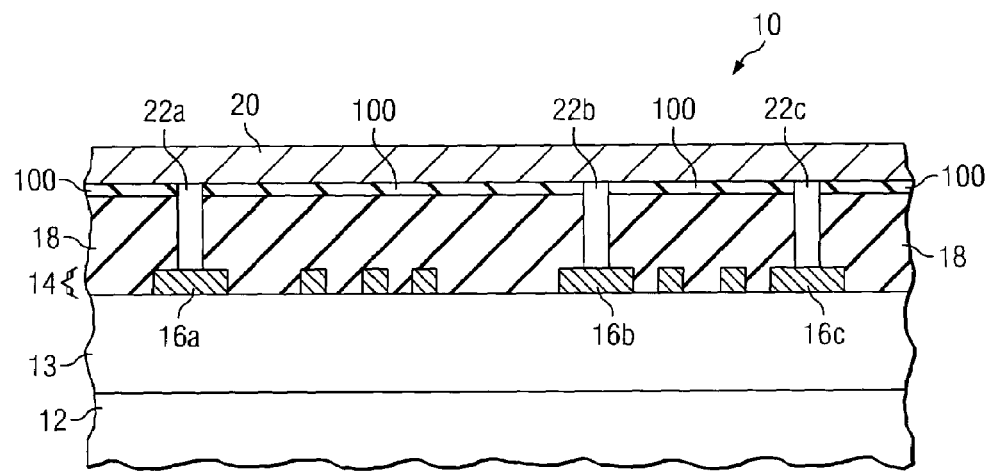

FIGS. 6a–6d show a process for forming the integrated circuit of FIGS. 3a and 3b. In summary, FIG. 6a shows the deposition of a thin layer of silicon oxide 100 and FIG. 6b shows the formation of via holes 22a, 22b, and 22c. In FIG. 6c the thin layer of silicon oxide 100 is etched in a cleaning chamber to remove some material from the top of silicon oxide 100. FIG. 6d shows the formation of post passivation metal layer 20. Each of these steps will now be described in greater detail.

Figure 1:
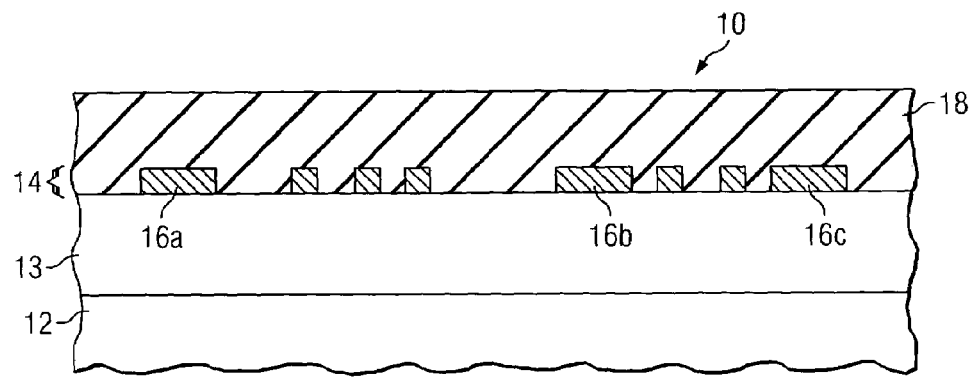
FIG. 1 shows a cross section of a conventional integrated circuit.
Figure 2A:
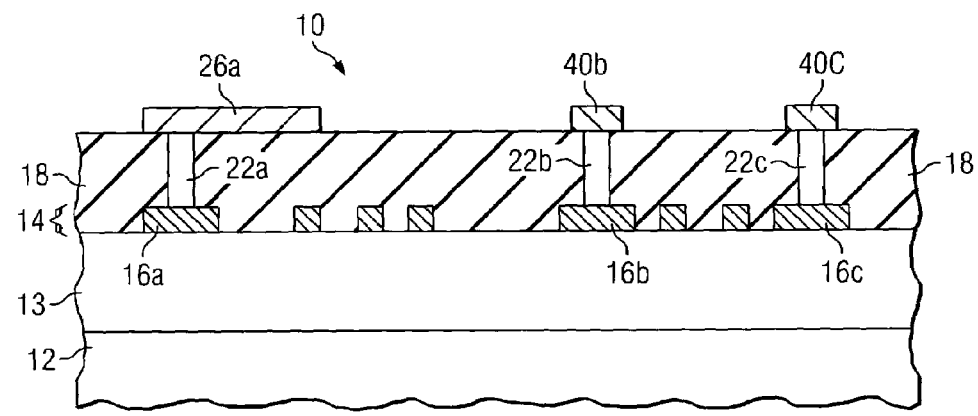
FIGS. 2a and 2b show, respectively, a cross section and a top view of an integrated circuit after of a conventional PPI process.
Figure 2B:
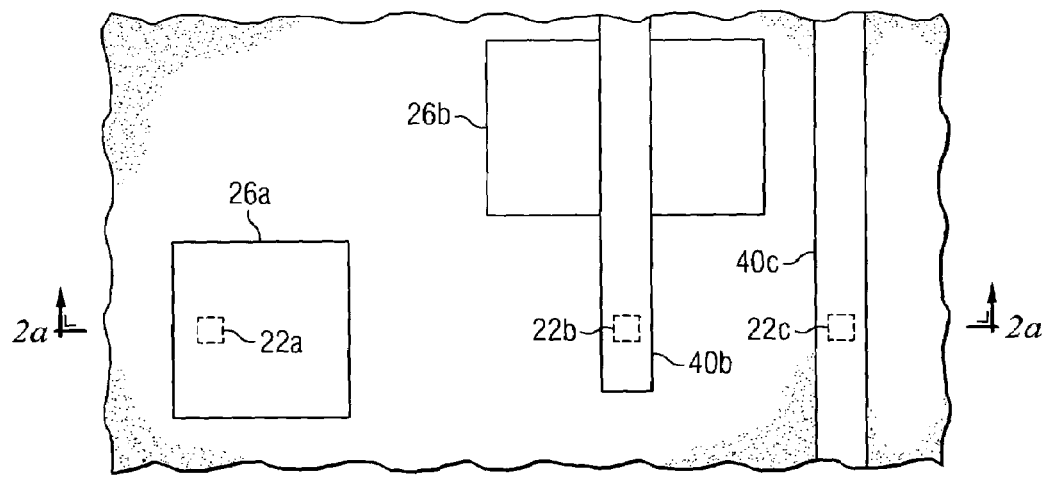

The process begins with a substantially completed integrated circuit as shown in FIG. 1. In this context, a substantially completed integrated circuit is an integrated circuit that has been formed to the point that only connection to outside circuits is necessary to allow the device to operate as designed. In this embodiment, the substantially completed integrated circuit includes a passivation layer 18. Passivation layer 18 can be a layer of silicon nitride. Passivation layer 18 can also include multiple layers of materials, with a layer of silicon nitride as the topmost layer.

Referring now to FIG. 6a, buffer layer 100 is deposited on top of passivation layer 18. For example, a silicon oxide (e.g., $SiO_2$) layer can be depositing using a chemical vapor deposition process, such as PECVD or LPCVD. In one embodiment, the thickness of silicon oxide 100 is about 25 nanometers. If passivation layer 18 is also deposited with a chemical vapor deposition process, silicon oxide 100 can be deposited on top of passivation layer 18 in the same chamber that passivation layer 18 is deposited. In this process, the chemical vapor used for depositing passivation layer 18 needs to be changed to the chemical vapor used for depositing silicon oxide 100.

In general, silicon oxide 100 is preferred to be deposited in a process that is in-situ with the process of depositing passivation layer 18. Silicon oxide 100 can be deposited after passivation layer 18 is deposited without breaking vacuums of disposition chambers. In FIG. 6b, via holes 22a, 22b, and 22c are formed using some well-known techniques.

Either before or after the deposition of buffer layer 100 (but after formation of via holes 22), the wafer that includes integrated circuit 10 will be tested (e.g., in a wafer acceptance test). This test can be accomplished by physically touching the contact regions 16 with test probes. After the test, the wafer can be rinsed with deionized water to clean test particles.

Referring now to FIG. 6c, an optional cleaning of the integrated circuit 10 is cleaned. During this process, an uppermost portion of buffer layer 100 is etched. This process is often performed in a cleaning chamber that that includes inner wall made primarily from quartz. For example, the PCII etch chamber of Applied Material's Endura system includes such a cleaning chamber.

As another example, the thin layer of silicon oxide 100 can be etched using an ion milling process. The ion milling process can use Argon ions in a plasma environment. During the ion milling process, typically, 5 to 20 nanometer thickness of silicon oxide are removed. One advantage of the preferred embodiment is that this removed material is less likely to contaminate wafers being processed.

Referring now to FIG. 6d, via holes 22 are formed through buffer layer 100 and passivation layer 18. The formation of via holes 22 is preferably performed using standard lithography processing. Via holes 22 are then filled with a conductor to form the plug. For example, a conductive layer material can be formed and then etched back or planarized by chemical mechanical polish.

FIG. 6d also shows the formation of post passivation metal layer 20. In the preferred embodiment, metal 20 includes multiple layers of materials. In one embodiment, a layer of titanium, e.g., about 150 nm, is deposited on silicon oxide 100, e.g., using a physical vapor deposition process. Subsequently, a layer of aluminum copper, e.g., about 2000 nanometers, is deposited over the titanium layer. The titanium layer serves as a barrier to prevent aluminum and copper atoms from migrating into other materials beneath the titanium layer.

After post passivation metal layer 20 is deposited over buffer layer 100, a connection pattern is formed in post passivation metal layer 20. The connection pattern can include contact pads 26 and conductors 40. These contact pads and conductors can be connected in variety of ways as defined by the connection pattern.

The connection pattern can be formed using known methods. For example, the connection pattern can be first defined using photolithograph techniques. Then, the unwanted areas on post passivation metal layer 20 can be removed in a reactive ion etching ("RIE") process. When post passivation metal layer 20 includes titanium, aluminum and copper layers, chemicals that can be used in the RIE process include $Cl_2$, $BCl_3$ and $F_3$. Once again, the buffer layer 100 can help to prevent particle contamination in the processing chamber.

After the metal layer 20 is etched, the photoresist (not shown) that was used to pattern will be stripped. A layer of polyimide (see FIG. 3a) is then coated and exposed and finally cured. This polyimide layer is patterned to expose contact pads 26.

Figure 7:
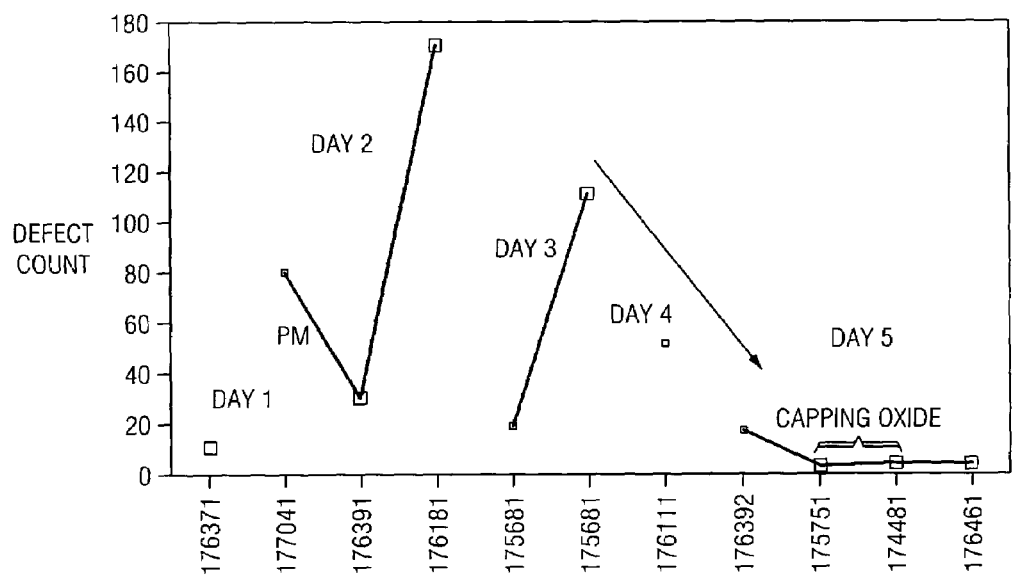
FIG. 7 shows experimental results comparing the defect rate for a PPI process of the present invention and a prior.

The improved PPI process as shown in FIGS. 6a–6d is intended to reduce the number of defects generated during the PPI process. In an experimental study, numbers of defects of the two processes are compared. The results of this experimentation are shown in FIG. 7. In this experimental study, passivation layer 18 is a layer of silicon nitride, and the clean chamber used in the two processes are made primarily from quartz. It was found that the PPI process of FIGS. 5a–5d shows an improvement over prior art PPI processes. In FIG. 7 the number of defects in integrated circuits is reduced by a factor between 10 to 100.

These improvements can be possibly explained in a number of ways. With a PPI process that does not include a buffer layer 100, passivation layer 18 is etched before the deposition of post passivation metal layer 20 and/or during etching of metal layer 20 and clusters of silicon nitride are knocked off from the surface of passivation layer 18. These clusters of silicon nitride form particles that do not stick very well to the quartz surface of the cleaning chamber. These particles can contaminate the surface of those integrated circuits that are processed in this chamber. If passivation layer 18 of an integrated circuit is contaminated with these particles, layers of materials on top of passivation layer 18 can peel off and cause defects on the integrated circuit.

Using the improved PPI process in FIGS. 6a–6d, when buffer layer 100 is etched in the cleaning chamber using a ion milling technique before the deposition of post passivation metal layer 20 and/or during etching of metal layer 20, clusters of silicon oxide are knocked off from the surface of buffer layer 100. These clusters of silicon oxide form particles that adhere to the quartz surface on the processing chamber. Thus, the number of particles that can contaminate the surface of integrated circuits being processed is reduced.

The scope of the present application is not intended to be limited to the particular embodiments of the circuit, process, machine, manufacture, means, methods and steps described in the specification. As one of ordinary skill in the art will readily appreciate from the disclosure of the present invention, circuits, components, processes, machines, manufacture, means, methods, or steps, presently existing or later to be developed, that perform substantially the same function or achieve substantially the same result as the corresponding embodiments described herein may be utilized according to the present invention. Accordingly, the appended claims are intended to include within their scope such circuits, components, processes, machines, manufacture, means, methods, or steps.

What is claimed is:

1. A method of forming post passivation interconnects for an integrated circuit having a first plurality of contact pads in a first connection pattern, the method comprising:

forming a passivation layer over the integrated circuit and over the first plurality of contact pads, wherein the first plurality of contact pads could otherwise be used to provide electrical connection to an external component in packaging the integrated circuit by the formation of wire bonds or solder balls on the first plurality of contact pads, the passivation layer being formed from a non-oxide material;

forming a buffer layer over the passivation layer, the buffer layer comprising a silicon oxide layer;

removing a top portion of the buffer layer;

depositing a post passivation metal layer over the buffer layer after removing a top portion of the buffer layer;

forming a second connection pattern in the post passivation metal layer such that portions of the second connection pattern are electrically coupled to the first plurality of contact pads, wherein the second connection pattern differs from the first connection pattern; and forming a second plurality of contact pads while forming the second connection pattern and as part of the second connection pattern.

2. The method of claim 1 wherein the top portion of the buffer layer is removed in a cleaning chamber having an inner wall comprising primarily quartz.

3. The method of claim 2 wherein the cleaning chamber is in a vacuum condition during the removing step and wherein the post passivation metal layer is deposited over the buffer layer after the removing step without breaking the vacuum condition in the cleaning chamber.

4. The method of claim 1 wherein passivation layer is formed in a first chamber that is in a vacuum condition and wherein the buffer layer is formed over the passivation layer in the first chamber and without breaking the vacuum condition in the first chamber after forming the passivation layer.

5. The method of claim 4 wherein the top portion of the buffer layer is removed in the first chamber, the method further comprising breaking a vacuum condition in the first chamber before the step of etching the buffer layer.

6. The method of claim 1 wherein the passivation layer comprises a layer of silicon nitride.

7. The method of claim 1 wherein the passivation layer comprises more than one layer and wherein an uppermost layer comprises silicon nitride.

8. The method of claim 1 wherein the buffer layer has a thickness substantially smaller than a thickness of the passivation layer and wherein the buffer layer has a thickness less than about 25 nanometers.

9. The method of claim 1 wherein the buffer layer has a thickness substantially smaller than a thickness of the passivation layer and wherein the ratio of the thickness of the passivation layer to the thickness of the buffer layer is greater than about 20.

10. A method of forming post passivation interconnects for an integrated circuit, the method comprising:
forming a passivation layer over a substantially complete integrated circuit and over a first plurality of contact pads, the first plurality of contact pads being in a first connection pattern, wherein the passivation layer is formed from a non-oxide material;
forming an oxide buffer layer over the passivation layer;
forming a metal layer over the oxide buffer layer; and
patterning the metal layer to form a second connection pattern comprising a second plurality of contact pads, wherein at least some of the second plurality of contact pads are electrically connected to at least some of the first plurality of contact pads, wherein at least some of the second plurality of contact pads are on a different level than the first plurality of contact pads, and wherein the second connection pattern differs from the first connection pattern.

11. The method of claim 10 wherein the oxide buffer layer is etched in a chamber that includes quartz inner walls.

12. The method of claim 10 wherein the thickness of the passivation layer is at least about 20 times greater than the thickness of the oxide buffer layer.

13. The method of claim 12 wherein the oxide buffer layer has a thickness of less than about 25 nm.

14. A method of forming a semiconductor device, the method comprising:
providing a silicon substrate having a plurality of active devices formed therein, the active devices being interconnected by a plurality of metal layers including an uppermost metal layer, the uppermost metal layer including a first plurality of contact pads, wherein the first plurality of contact pads could otherwise be used to provide electrical connection to an external component in packaging an integrated circuit chip comprising the semiconductor device by forming wire bonds or solder balls on the first plurality of contact pads;
forming a nitride passivation layer overlying the uppermost metal layer except for selected contact openings to the first plurality of contact pads;
forming an oxide buffer layer overlying the nitride passivation layer, the oxide buffer layer having a thickness substantially smaller than a thickness of the nitride passivation layer; and
forming a post passivation metal layer overlying the oxide buffer layer, the post passivation metal layer patterned so as to electrically couple the first plurality of contact pads to a second plurality of contact pads formed in the post passivation metal layer.

15. The method of claim 14 wherein forming a nitride passivation layer comprises forming a silicon nitride layer and wherein forming an oxide buffer layer comprises forming a silicon oxide layer.

16. The method of claim 14 wherein forming an oxide buffer layer comprises forming an oxide buffer layer with a thickness of less than 25 nanometers.

17. The method of claim 14 wherein thickness of the nitride passivation layer is at least about 20 times greater than the thickness of the oxide buffer layer.

18. The method of claim 14 wherein the first plurality of contact pads are disposed around the periphery of the chip and the second plurality of contact pads are arranged over a central portion of the chip.

19. The method of claim 14 and further comprising:
providing a package substrate having a plurality of package contact pads arranged in a configuration corresponding to the second plurality of contact pads on the chip; and
attaching the package contact pads of the package substrate to the second plurality of contact pads on the chip via a plurality of solder bumps, wherein the solder bumps electrically couple the second plurality of contact pads on the chip with the package contact pads on the package substrate.

20. The method of claim 14 wherein the uppermost metal layer comprises a layer of copper.

21. A method of forming a post passivation metal layer over an integrated circuit, the method comprising:
providing a substantially completed integrated circuit formed to the point that only connection to an external circuit would be needed to allow the device to operate, the substantially completed integrated circuit including a silicon nitride passivation layer at an uppermost surface;
forming an oxide buffer layer over and physically contacting the silicon nitride passivation layer, the oxide buffer layer having a thickness substantially smaller than a thickness of the passivation layer;
removing a top portion of the oxide buffer layer, the top portion of the buffer layer being removed in a cleaning chamber having an inner wall comprising primarily quartz, the cleaning chamber being held in a vacuum condition during the removing;
depositing a metal layer over and physically contacting the oxide buffer layer, wherein the metal layer is deposited after the removing step without breaking the vacuum condition in the cleaning chamber; and patterning the metal layer to form a connection pattern comprising a plurality of contact pads.

22. The method of claim 21 wherein the passivation layer comprises a layer of $Si_3N_4$.

23. The method of claim 21 wherein the passivation layer comprises more than one layer and wherein an uppermost layer comprises silicon nitride.

24. The method of claim 21 wherein forming an oxide buffer layer comprises forming buffer layer that has a thickness of less than about 25 nanometers.

25. The method of claim 21 wherein the ratio of the thickness of the passivation layer to the thickness of the buffer layer is greater than about 20.

* * * * *